United States Patent [19]
Nishi

[11] Patent Number: 5,356,261
[45] Date of Patent: Oct. 18, 1994

[54] WAFER BOAT ROTATING APPARATUS

[75] Inventor: Hironobu Nishi, Sagamihara, Japan

[73] Assignees: Tokyo Electron Kabushiki Kaisha, Japan; Tokyo Electron Tohoku Kabushiki Kaisha, Japan

[21] Appl. No.: 103,666

[22] Filed: Aug. 10, 1993

[30] Foreign Application Priority Data

Aug. 17, 1992 [JP] Japan .................. 4-239995

[51] Int. Cl.⁵ .................................. B65G 69/00
[52] U.S. Cl. .................. 414/744.7; 414/172; 414/404; 414/938; 414/940; 901/30
[58] Field of Search ........... 414/152, 156, 172, 404, 414/417, 938, 940, 222, 680, 744.7; 901/18, 30; 432/241

[56] References Cited

U.S. PATENT DOCUMENTS

| | | | |
|---|---|---|---|
| 5,028,195 | 7/1991 | Ishii et al. | 414/222 |
| 5,123,804 | 6/1992 | Ishii et al. | 414/680 |
| 5,131,799 | 7/1992 | Nishi et al. | 414/416 |
| 5,163,832 | 11/1992 | Ishii et al. | 432/241 |
| 5,178,639 | 1/1993 | Nishi | 414/404 X |
| 5,180,273 | 1/1993 | Sakaya et al. | 414/940 X |

*Primary Examiner*—David A. Bucci
*Attorney, Agent, or Firm*—Beveridge, DeGrandi, Weilacher & Young

[57] ABSTRACT

A wafer boat rotating apparatus is disclosed, which includes a boat holding portion for holding both ends of the wafer boat, a vertical rotation drive mechanism for rotating the boat holding portion on a vertical plane, and a horizontal rotation drive mechanism for rotating the boat holding portion on a horizontal plane. A wafer holding member is disposed on the boat holding portion and adapted to keep the wafers held in the wafer boat apart from a bottom portion of the wafer boat by a small distance. Thus, compensation for the difference of coefficients of thermal expansion between the wafers and wafer boat during heat treatment can be made easily.

12 Claims, 6 Drawing Sheets

WAFER BOAT ROTATING APPARATUS

BACKGROUND OF THE INVENTION

1. Field of the Invention

The present invention relates to a wafer boat rotating apparatus for rotating a wafer boat holding wafers.

2. Description of the Related Art

Generally, when semiconductor wafers and liquid crystal wafers are produced, oxide films, metal films, single-crystal films, and so forth are deposited or impurity-diffused on wafer surfaces. As units for performing such treatments, heat-treating units such as an oxidizing unit, a CVD unit, an epitaxial unit, and a diffusing unit are known.

In such a heat-treating apparatus, for example six lots (namely, 150 wafers) which are arranged with an equal pitch are held by a wafer boat made of heat resisting material which can withstand high temperatures and does not give rise to impurities at high temperatures. An example of such a heat resisting material is quartz.

Normally, as heat-treating apparatuses, upright type heat-treating furnaces have been widely used. In this heat-treating furnace, a wafer boat is placed in an upright (vertical) position. The wafer boat is transferred using one of the following two systems. One system is referred to as a stand-along system. In this system, wafers transferred by an arm to a wafer boat which is placed in a upright position. This arm carries one or five wafers at a time. The other system is referred to as batch system. In the batch system, 25 wafers are transferred to a wafer boat which is placed in a flat position at a time. After all 150 wafers are transferred, the wafer boat is raised.

In the stand-alone system, one heat-treating furnace requires a corresponding transfer unit. On the other hand, in the batch system, one transfer unit can handle a plurality of (for example, four) heat-treating furnaces. Thus, from the viewpoints of space and cost reduction, the batch system is superior to the stand-alone system. Therefore, the batch system is increasingly used.

When the batch system is used, as described above, a wafer boat rotating apparatus which places in an upright position and a flat position the wafer boat containing wafers is required.

The wafer boat rotating apparatus is disposed between the heat-treating unit and a wafer transfer unit. The heat-treating unit consists of, for example, four heat-treating furnaces arranged in series. The wafer transfer unit has a transfer mechanism which transfers for example twenty five (25) wafers held in a carrier to a wafer boat which is placed in a flat position. This wafer transfer mechanism is disclosed in for example U.S. Pat. No. 5,131,799 which is shown in FIGS. 7 and 8 thereof. This wafer boat rotating apparatus has a boat holding portion with a pair of arms which hold both ends of a wafer boat. The boat holding portion is mounted on a rotating shaft of a vertical rotation drive mechanism which has a motor and so forth. The vertical rotation drive mechanism rotates the boat holding portion on a vertical plane. The vertical rotation drive mechanism is mounted on a vertical drive mechanism which comprises a ball screw and a motor. The ball screw extends vertically. The motor rotates the ball screw. The vertical drive mechanism vertically moves the boat holding portion. A horizontal rotation drive mechanism is housed in a base and disposed at a lower end portion of the vertical drive mechanism. The horizontal rotation drive mechanism has a motor and so forth. As the vertical drive mechanism rotates on a horizontal plane, the boat holding portion accordingly rotates on the horizontal plane.

When wafers are transferred, a reception table of the transfer mechanism is raised from a downward position of the carrier on the wafer transfer unit, 25 wafers are held upward of the wafer transfer unit. The wafers held at the upper position are nipped by a wafer nipping member of the transfer mechanism. Then, the wafer nipping member is horizontally moved to the position above the wafer boat horizontally supported on a boat table of the wafer transfer unit. A reception table is raised from the downward portion of the wafer boat, and then the 25 wafers are supported by the reception table. The wafer nipping member is opened and then the reception table is lowered. In this way, the 25 wafers are transferred into the wafer boat. This operation is repeated for example four times. Thus, a total of 100 wafers are transferred.

After all the wafers have been transferred to the wafer boat, both ends thereof are held by the arms of the boat holding portion. Thereafter, the vertical rotation drive mechanism is rotated by 90° so as to place the wafer boat in upright position. In addition, the horizontal rotation drive mechanism is rotated by 180° so as to orient the wafer boat to the heat-treating unit.

By operating the vertical drive mechanism in a predetermined manner, the wafer boat is moved onto the transfer state of the heat-treating unit. This stage is moved to a transfer entrance/exit of a predetermined heat-treating furnace along a path connected thereto. The wafer boat placed on the stage is transferred to an elevator of the heat-treating furnace by a robot arm. The elevator vertically moves and the wafers held in the wafer boat are loaded into the heat-treating furnace.

When wafers which have been heat-treated are unloaded from the heat-treating furnace, the above-described operation is performed in reverse order.

The wafer boat comprises two holding plates and four wafer holding rods. Each of the wafer holding rods has a large number of (for example, 100) wafer holding grooves. By each groove, the peripheral portion of a wafer is held.

When wafers are transferred to the wafer boat which is placed in a flat position, a peripheral portion of each wafer comes in contact with a bottom portion of a corresponding wafer holding groove of the lower wafer holding rod. Thus, the wafer is held. In this condition, edge portions extruding from the holding plate are held and then the wafer boat is raised from the flat position to the upright position. Next, the wafers are transferred to the heat-treating furnace and heat-treated in the furnace.

However, there is a difference in coefficients of thermal expansion between quartz (which is a constructional element of the wafer boat) and a wafer. Thus, each wafer should be smooth against the inner wall surfaces of the wafer holding groove by the amount equivalent to the difference of the coefficients of thermal expansion. When each wafer is relatively light (as in a wafer with a diameter of six inches), the difference of coefficients of thermal expansion is absorbed without a problem. As the wafer size becomes large (as in eight inches), the weight of the wafer increases. For example, the weight of an eight-inch wafer is twice the weight of a six-inch wafer. Thus, when such large wafers are heat-treated, they do not satisfactorily slide and thereby the difference of coefficients of thermal expansion cannot be absorbed. Therefore, the stress which take place at the peripheral portion of each wafer becomes very large and thereby a slip dislocation takes place in the crystalline direction.

To solve such a problem, the shape of the wafer holding grooves may be changed in various manners. However, so far, the difference of coefficients of thermal expansion between wafer boat and wafers has not been satisfactorily absorbed.

SUMMARY OF THE INVENTION

An object of the present invention is to provide a wafer boat rotating apparatus for keeping the peripheral portion of a wafer apart from the bottom portion of the wafer holding groove so as to satisfactorily absorb the difference of coefficients of thermal expansion, thereby preventing a slip dislocation from taking place.

The present invention is a wafer boat rotating apparatus disposed between a wafer transfer unit being adapted to transfer a plurality of wafers to a wafer boat which is held in a horizontal direction and which defines an opening at a bottom portion thereof and a heat-treating unit being adapted to heat-treat the wafers held in the wafer boat held in vertical direction, the apparatus comprising a boat holding portion for holding both ends of the wafer boat, a vertical rotation drive mechanism for rotating the boat holding portion on a vertical plane thereof, a horizontal rotation drive mechanism for rotating the boat holding portion on a horizontal plane thereof, and a wafer holding member disposed on the boat holding portion and being adapted to keep the wafers held in the wafer boat apart from a bottom portion of the wafer boat by a small distance.

According to the present invention, when the wafer boat placed in flat position is held by the boat holding portion, the wafer holding member disposed on the boat holding portion keeps each wafer apart from the bottom portion of the wafer boat by a small distance. In this condition, the vertical rotation drive mechanism is operated so that the wafer boat is raised. Thus, the side surface of each wafer is held in the wafer boat. In this condition, the horizontal rotation drive mechanism and the vertical drive mechanism are operated so that the wafer boat is transferred to the heat-treating unit. In the heat-treating unit, each wafer is heat-treated. The difference of coefficients of thermal expansion between the wafer boat and the wafers which takes place in the heat treatment is absorbed since the wafers satisfactorily slide. Thus, the wafers can be prevented from being stressed.

These and other objects, features and advantages of the present invention will become more apparent in light of the following detailed description of a best mode embodiment thereof, as illustrated in the accompanying drawings.

DETAILED DESCRIPTION OF PREFERRED EMBODIMENT

Next, with reference to the accompanying drawings, a wafer boat rotating apparatus according to an embodiment of the present invention will be described in detail.

Figure 1:
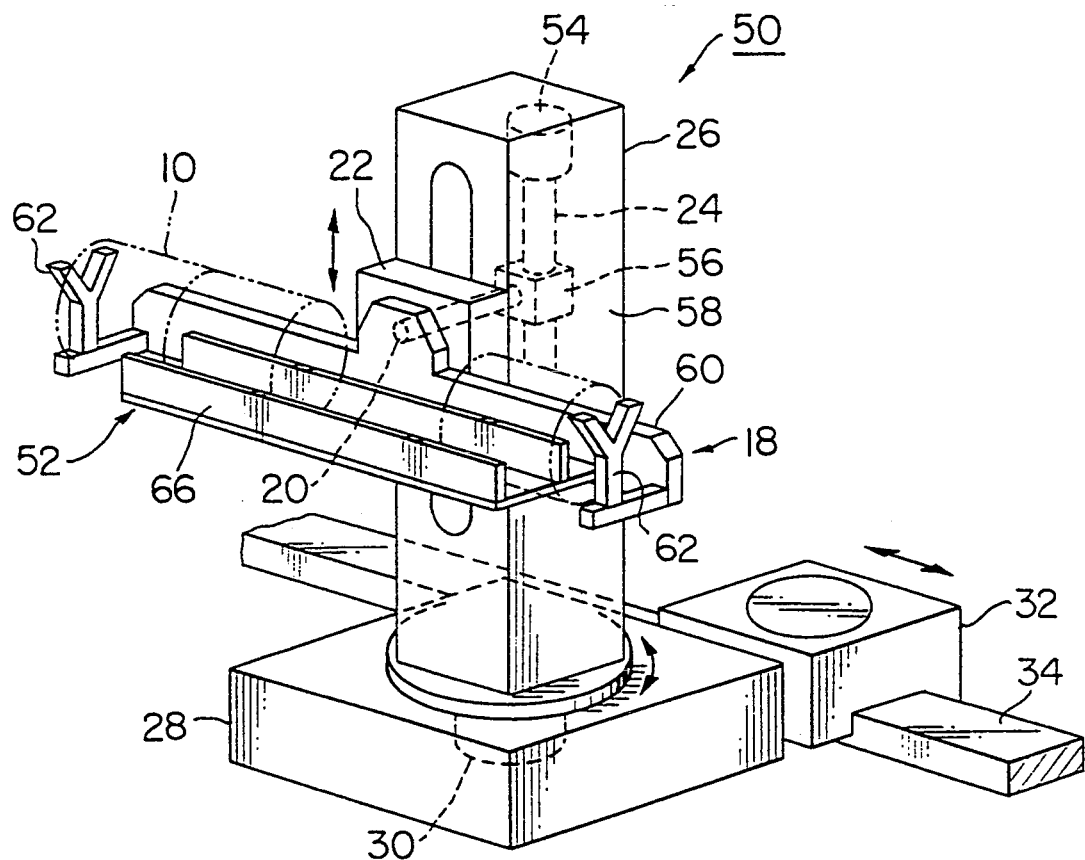
FIG. 1 is a perspective view showing a wafer boat rotating apparatus according to an embodiment of the present invention.
Figure 2:
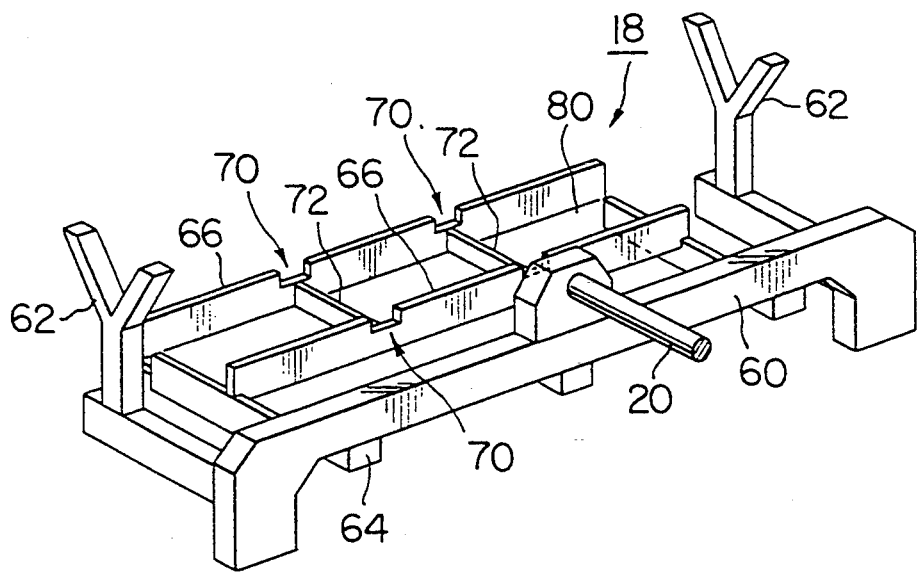
FIG. 2 is a perspective view showing a boat holding portion of the wafer boat rotating apparatus of FIG. 1.
Figure 3:
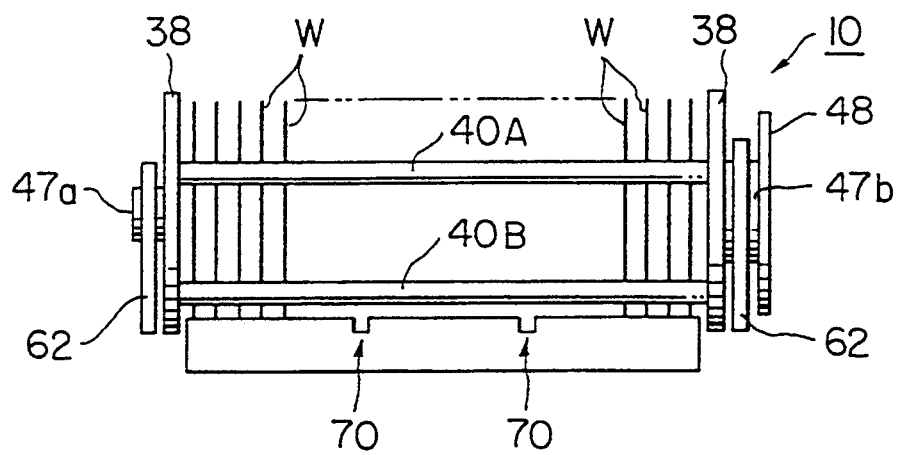
FIG. 3 is a side view showing the wafer boat where the wafer boat is held by the boat holding portion.
Figure 4:
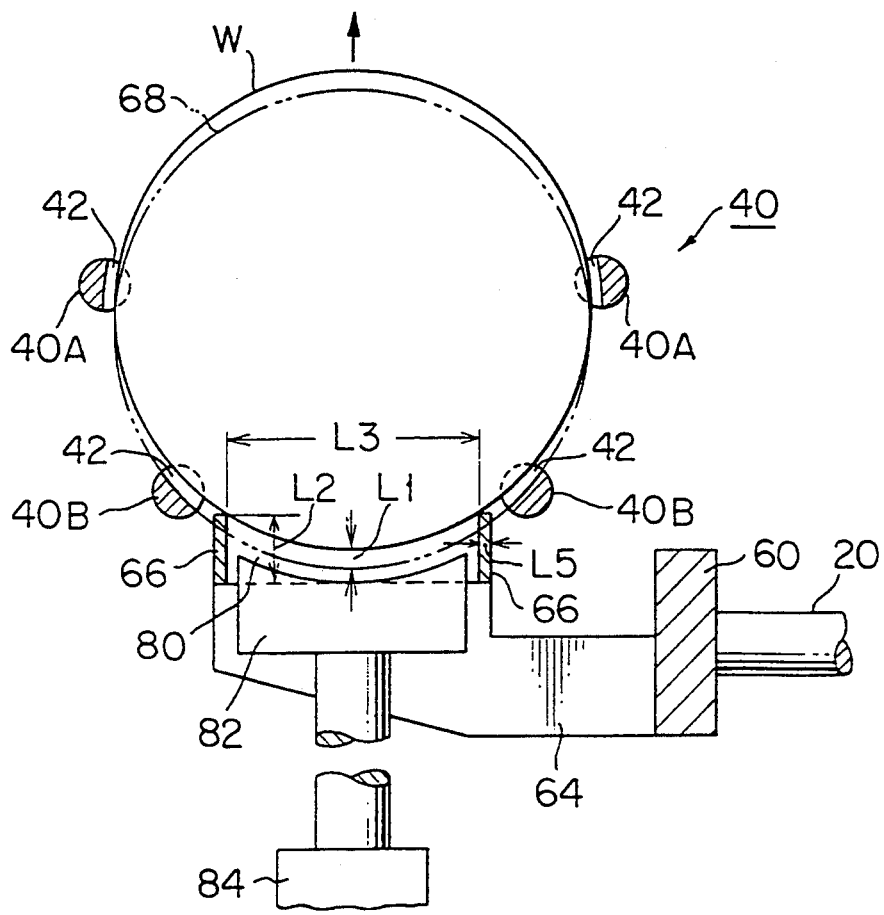
FIG. 4 is a sectional view showing a wafer holding portion.
Figure 6:
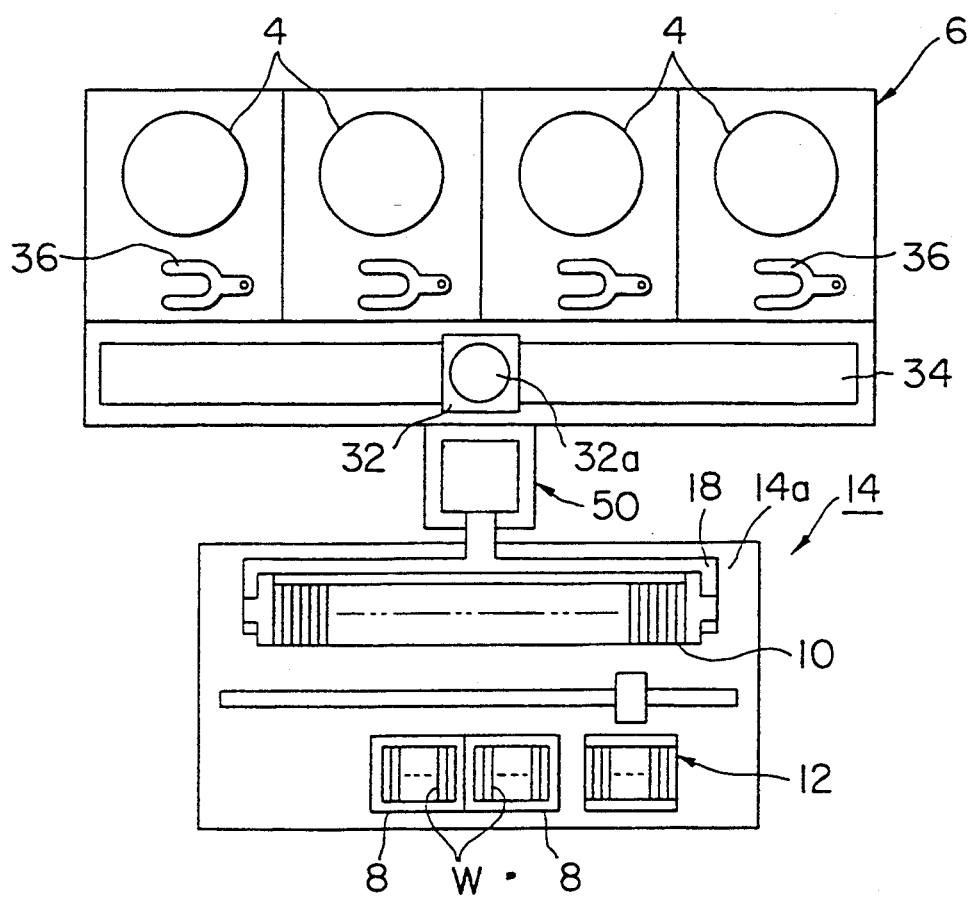
FIG. 6 is a plan view schematically showing an entire system including peripheral units for explaining a position at which the wafer boat rotating apparatus is installed.
Figure 8:
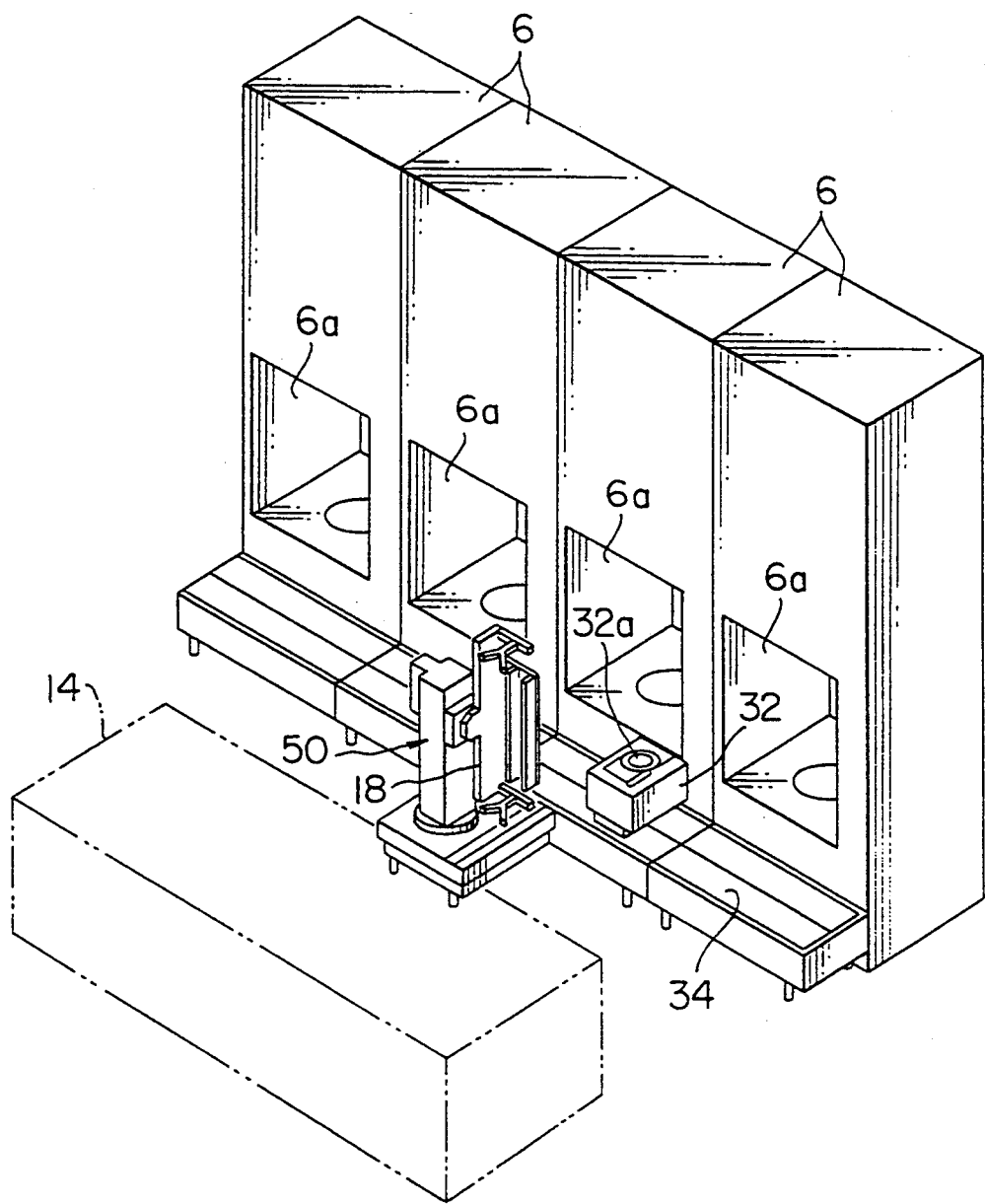
FIG. 8 is a perspective view of FIG. 6.

FIG. 1 is a perspective view showing a wafer boat rotating apparatus according to an embodiment of the present invention. FIG. 2 is a perspective view showing a boat holding portion of the wafer boat rotating apparatus of FIG. 1. FIG. 3 is a side view showing the wafer boat where the wafer boat is held by the boat holding portion. FIG. 4 is a sectional view showing a wafer holding portion. FIG. 6 is a plan view schematically showing an entire system including peripheral units for explaining a position at which the wafer boat rotating apparatus is installed. FIG. 8 is a perspective view of FIG. 6.

In FIGS. 6 and 8, a wafer boat rotating apparatus 50 is disposed between a heat-treating unit 6 and a wafer transfer unit 14. The heat-treating unit 6 consists of for example four heat-treating furnaces 4 which are disposed in series. The wafer transfer unit 14 has a transfer mechanism 12 which transfers for example twenty five (25) wafers W held in a carrier 8 to a wafer boat 10 placed in a flat position. The heat-treating furnaces 4 each have an entrance/exit opening 4a.

As shown in FIG. 1, the wafer boat rotating apparatus 50 comprises a boat holding portion 18, a vertical rotation drive mechanism 22, a vertical drive mechanism 26, a horizontal rotation drive mechanism 30, and a wafer holding member 52. The boat holding portion 18 holds edge portions 47a and 47b (see FIG. 3) disposed on both ends of the wafer boat 10. The vertical rotation drive mechanism 22 rotates the boat holding portion 18 on a vertical plane. The vertical drive mechanism 26 vertically moves the boat holding portion 18. The horizontal rotating drive mechanism 30 rotates the boat holding portion 18 on a horizontal plane. The wafer holding member 52 slightly lifts up the wafers W from the wafer boat 10 when the wafer boat 10 is raised in a flat position.

Practically, the vertical rotation drive mechanism 22 is provided with a motor and so forth (not shown). A rotating shaft 20 of the vertical rotation drive mechanism 22 is connected to a longitudinal center portion of the boat holding portion 18 so that the boat holding portion 18 is rotated on a vertical plane.

The vertical drive mechanism 26 has a ball screw 24 and a motor 54. The ball screw 24 extends vertically. The motor 54 rotates the ball screw 24. A movable member 56 which moves along the ball screw 24 is connected to the vertical rotation drive mechanism 22. Thus, the boat holding portion 18 moves vertically. The vertical drive mechanism 26 is covered by a housing 58 having a cubic shape.

The horizontal rotation drive mechanism 30 is disposed at a lower end portion of the vertical drive mechanism 26. The horizontal rotation drive mechanism 30 is housed in a base 28. The horizontal rotation drive mechanism 30 consists of a motor and so forth. As the vertical drive mechanism 26 is rotated on a horizontal plane, the boat holding portion 18 is rotated on a horizontal plane.

As shown in FIG. 2, the boat holding portion 18 has a holding brace 60. A longitudinal center portion of the holding brace 60 is connected to the rotating shaft 20. The holding brace 60 extends nearly in the longitudinal direction of the wafer boat 10. A pair of Y-letter shaped boat holding arms 62 are disposed at both ends of the holding brace 60 in such a way that open portions of the boat holding arms 62 face upward. These open portions hold the edge portions 47a and 47b disposed on both ends of the wafer boat 10. A holding arm 64 extends horizontally from a lower portion of the holding brace 60 to a portion below the wafer boat 10. The holding arm 64 is made of for example stainless steel so as to have a predetermined rigidity which can withstand the weight of the wafers W.

The holding arm 64 has a pair of wafer lift-up plates 66 spaced apart by a predetermined distance along the longitudinal direction of the holding brace 60 (namely, in the longitudinal direction of the wafer boat 10). The holding arm 64 and the pair of wafer lift-up plates 66 compose the wafer holding member 52. A space which is open upward and downward is formed between the pair of wafer lift-up plates 66. A reception table 82 is provided within the space 80 and is vertically driven by a cylinder 84. The 25 wafers W are vertically held by the reception table 82. The center between the pair of wafer lift-up plates 66 accords with the center between the pair of boat holding arms 62 (see FIG. 2). When the wafer boat 10 is held by the boat holding portion 18, the wafers W are lifted up by the pair of wafer lift-up plates 66. Thus, the wafers W are kept apart from a lower wafer holding rod 40B by a small distance L1, (for example, 0.5 to 1.0 mm) (see FIG. 4).

Thus, the height L2 of the wafer lift-up plates 66 is determined so that when the wafers W are transferred to the wafer boat 10 placed in a flat position (horizontally), the upper end of the wafer lift-up plates are higher than the lower periphery 68 of the wafers W by a small distance (for example, 0.5 to 1.0 mm). When the wafers W having a diameter of eight inches are used, the distance L3 between the wafer lift-up plates 66 is determined to approximately 108 mm. At this time, the height L2 of the wafer lift-up plate 66 is determined to be approximately 28 mm so that the lower periphery of the wafers W does not come in contact with the holding arm 64.

Figure 5:
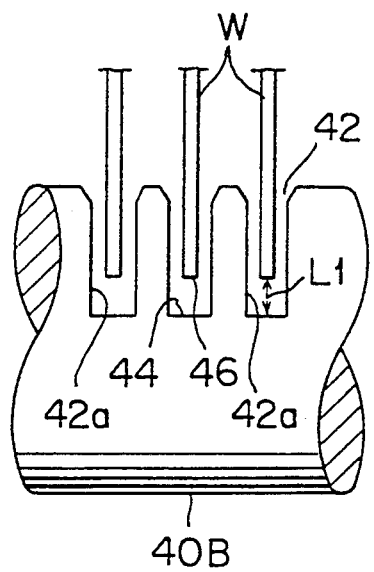
FIG. 5 is a partially enlarged view showing a wafer holding rod for explaining the operation of the present invention.
Figure 7:
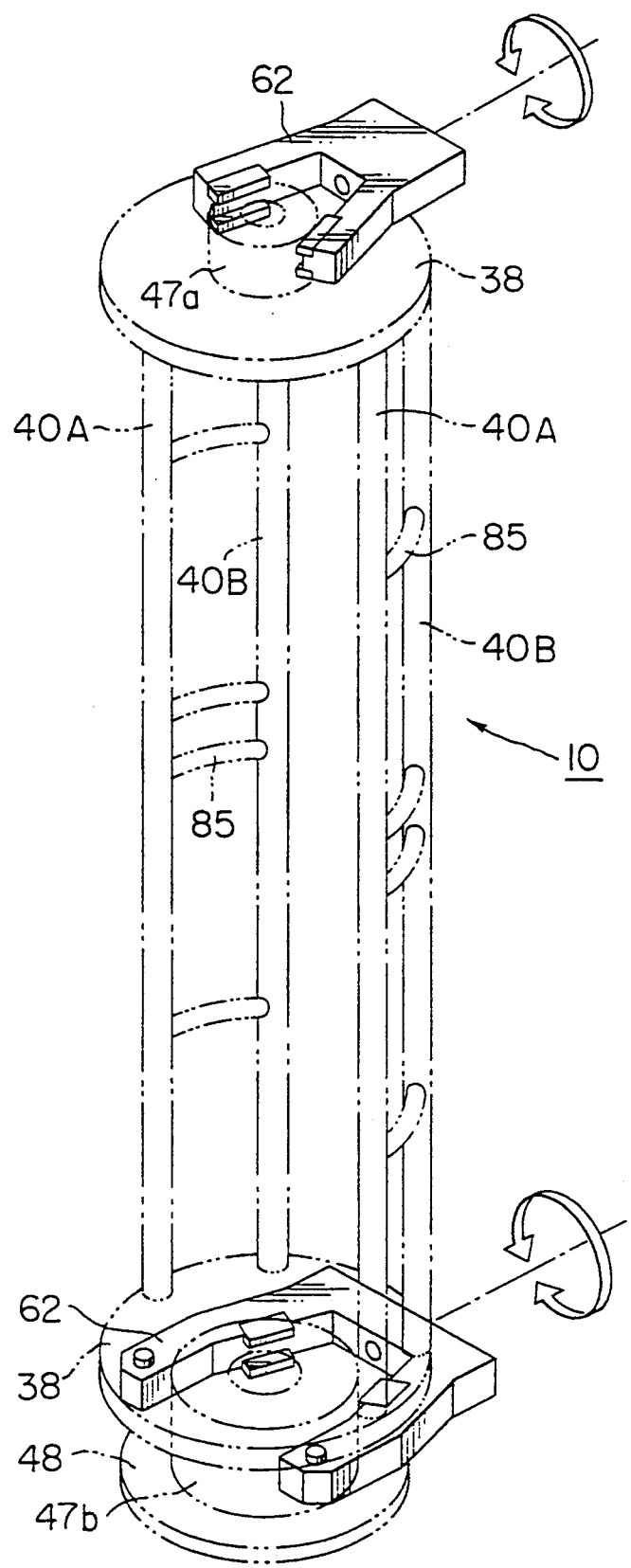
FIG. 7 is a detailed perspective view showing the wafer boat.

As shown in FIGS. 3, 5, and 7, the wafer boat 10 comprises a pair of holding plates 38 and four wafer holding rods 40A and 40B. The four wafer holding rods 40A and 40B extend between the pair of holding plate 38. The wafer holding rods 40A and 40B each has a large number of (for example, 150) wafer holding grooves 42, each holding a periphery portion of each of the wafers W.

As described above, when the wafer boat 10 placed in a flat position (namely, horizontally) is held by the boat holding portion 18, the wafers W are lifted up by the pair of wafer lift-up plates 66. When the wafer boat 10 is raised in an upright position, the wafers W are held by inner wall surfaces 42a of the corresponding wafer holding grooves 42 (see FIG. 5). In addition, as described above, the pair of holding plates 38 of the wafer boat 10 have the edge portions 47a and 47b which are held by the pair of Y-letter shaped boat holding arms 62 and 62, respectively. The diameter of the edge portion 47b is larger than the diameter of the edge portion 47a. The edge portion 47b has a flange 48. Reinforcement members 85 are arranged between the two wafer holding rods 40A and between the two wafer holding rods 40B in a direction perpendicular to the longitudinal direction of the wafer boat 10.

Figure 11:
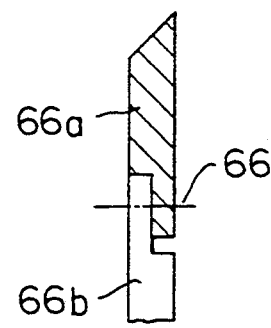
FIG. 11 is a detailed schematic diagram showing a wafer lift-up plate.

As shown in FIG. 4, the thickness L5 of the pair of lift-up plates 66 is determined to approximately 4 mm. Respective upper end portions of the pair of wafer lift-up plates 66 face to each other and incline downwardly in an inner direction corresponding to a circular shape of the wafers W. As shown in FIG. 11, the wafer lift-up plates 66 each has a contact portion 66a. The contact portion 66a is made of material which has a high temperature resistance and stability so as to prevent the wafers W from being contaminated with metals. Examples of such material are Teflon (trade name) and quartz. The contact portion 66a is held by a body 66b made of stainless steel.

As shown in FIG. 3, concave portions 70 are formed in the wafer lift-up plates 66. The concave portions 70 prevent the wafer lift-up plates 66 from interfering with the reinforcement members 85. A reinforcement plate 72 is disposed in the vicinity of the concave portions. The reinforcement plate 72 connects the pair of wafer lift-up plates 66.

Next the operation of the embodiment will be described.

Figure 9:
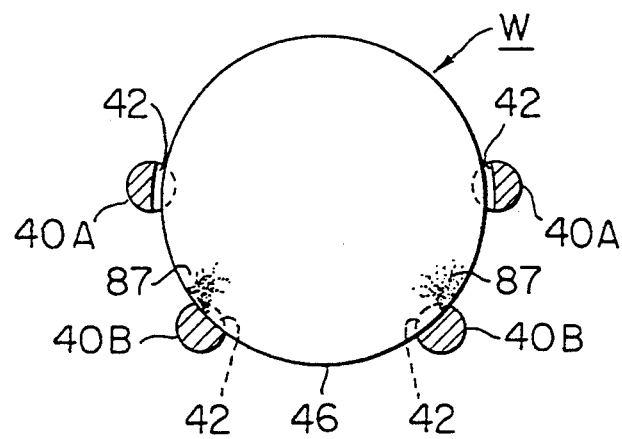
FIG. 9 is a schematic diagram for explaining a condition where a slip dislocation takes place in a heat treatment in the case that the wafer holding portion is not provided.
Figure 10:
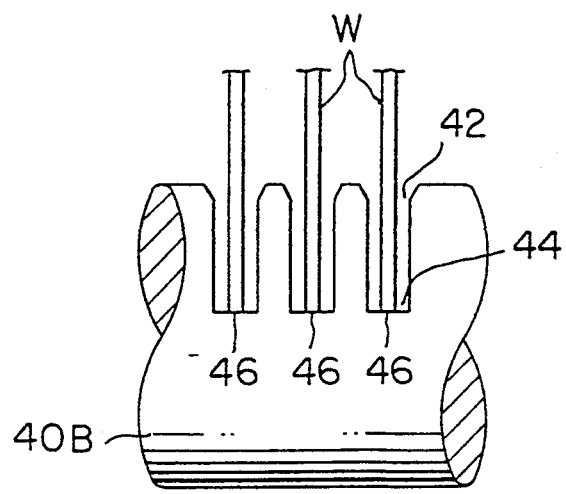
FIG. 10 is a schematic diagram for explaining a condition where wafers come in contact with corresponding wafer holding grooves of a wafer holding rod in the case that the wafer holding portion is not provided.

As shown in FIG. 6, all the 25 wafers W held in the carrier 8 are transferred to the wafer boat 10 placed in flat position (horizontally) on the boat table 14a of the wafer transfer unit 14 by the transfer mechanism 12 at a time. By repeating this transfer operation for example six times, 150 wafers W are transferred to the wafer boat 10. In this embodiment, the wafers W transferred from the transfer unit 12 are received by a reception table 82. The reception table 82 is vertically moved by the cylinder 84 in the space 80 defined by the pair of wafer lift-up plates 66. In this condition, as shown in FIGS. 9 and 10, the wafers W are held in the wafer holding grooves 42 defined on the wafer holding rods 40A and 40B. Thus, outer peripheral portions 46 of the wafers W come in contact with bottom portions 44 of the two lower wafer holding rods 40B.

As the wafer boat rotating unit 50 is operated, the wafer boat 10 is raised by the boat holding portion 18 which is placed in a flat position as shown in FIG. 3. At this time, the edge portions 47a and 47b which protrude from the holding plates 38 and 38 are held by the Y-letter shaped boat holding arms 62, respectively. Thus, the entire wafer boat 10 is horizontally raised. At this time, since the holding arm 64 has the pair of wafer lift-up plates 66, the upper end portions of the wafer lift-up plates 66 come in contact with the lower peripheral portion 46 of each of the wafers W, thereby lifting up the wafers W by a slight distance L1, for example, 0.5 to 1.0 mm. Consequently, as shown in FIGS. 4 and 5, the lower peripheral portion 46 of each of the wafers W is kept apart from the bottom portion 44 of the corresponding holding groove 42 of each of the two lower wafer holding rods 40B nearly by the distance L1. It should be noted that as with the two lower wafer holding rods 40B, the peripheral portion 46 of each of the wafers W may be kept apart from the bottom portion 44 of the corresponding holding groove 42 of each of the two upper wafer holding rods 40A by the distance L1.

As described above, when the wafer boat 10 placed in flat position (horizontally) is raised by the boat holding portion 18, the wafers W are lifted up from the wafer boat 10 by the small distance L1. Thus, the peripheral portion 46 of each of the wafers W is kept apart from the corresponding groove bottom portion 44.

In this condition, by rotating the vertical rotation drive mechanism 22 by 90° at a low speed, the wafer boat 10 is raised in an upright position. Next, by rotating the horizontal rotation drive mechanism 30 by 180°, the wafer boat 10 is oriented to the heat-treating unit 6. Thus, each of the wafers W is held on the inner wall surface 42a of the wafer holding groove 42 of each of the four wafer holding rods 40A and 40B.

As shown in FIGS. 6 and 8, by operating the vertical drive mechanism 26 in a predetermined manner, the wafer boat 10 is lowered. The wafer boat 10 which is placed in upright position is moved to a table 32a of the transfer stage 32. The stage 32 moves to an entrance/exit opening of a predetermined heat-treating furnace 4 of the heat-treating unit 6 along a transfer path 34. The wafer boat 10 placed on the table 32a of the stage 32 is transferred to an elevator (not shown) of the heat-treating furnace 4 by a robot arm 36 disposed at each heat-treating furnace 4. The elevator upwardly moves and thereby the wafer boat 10 is loaded to the heat-treating furnace 4.

The wafers W loaded to the heat-treating furnace 4 are heat-treated corresponding to predetermined process conditions. In this heat treatment, the coefficient of thermal expansion of quartz ($5.4 \times 10^{-7}/°$ C.) forming the wafer boat 10 is smaller than the coefficient of thermal expansion of silicon ($4.8 \times 10^{-6}/°$ C.) forming the wafers W, resulting in a difference of the thermal expansion between the wafer boat 10 and the wafers W. As described above, since the peripheral portion 46 of each of the wafers W is kept apart from the corresponding groove bottom portion 44 of each of the wafer holding rods 40A and 40B, each of the wafers W equally slides on the inner wall surface (contacting surfaces) 42a of the corresponding wafer holding groove 42 of each of the upper and lower wafer holding rods 40a and 40B. Thus, the groove bottom portion 44 of each wafer holding groove 42 does not apply any excessive stress to the peripheral portion 46 of each of the wafers W. As a result, the wafers W can be securely prevented from slip-dislocating.

In other words, as shown in FIGS. 9 and 10, unless the wafer lift-up plates 66 are provided, each of the wafers W in the wafer boat 10 placed in flat position comes in contact with the bottom portion 44 of the corresponding wafer holding groove 42 of each of the lower wafer holding rods 40B due to the dead weight of the wafers W. When the wafer boat 10 is raised in an upright position and then is heated at approximately 1000° C., the wafers W having a diameter of eight inches expand by approximately 1 mm, whereas the wafer boat 10 expands by approximately 0.1 mm. At this time, due to the difference of the thermal expansion of the wafer boat 10 and the wafers W, a slip dislocation 87 takes place in the wafers W in the vicinity of the lower wafer holding rods 40B.

However, according to the present invention, since the peripheral portion 46 of each of the wafers W is out of contact with the bottom portion of the corresponding holding groove of each of the wafer holding rods, each of the wafers W slides on the inner wall surface 42a of the corresponding wafer holding groove. Thus, the difference of the thermal expansion which take place between the wafer boat 10 and the wafers W can be easily absorbed. After the wafers W have been heat-treated, they are unloaded from the heat-treating furnace by performing the above-described operation in reverse order.

In the above-described embodiment, two wafer lift-up plates 66 were used. However, it should be noted that the number of the wafer lift-up plates 66 is not limited to two. Instead, one wafer lift-up plate may be disposed just below the center portion of the wafers W (the center portion of the pair of boat holding arms 62). In this case, the lift-up plate 66 may have a predetermined thickness.

The present invention may be applied to various heat-treating units such as an oxidizing unit, a CVD unit, an epitaxial unit, and a diffusing unit.

As described above, according to the wafer boat rotating apparatus of the present invention, the following excellent effects may be accomplished.

The wafer boat 10 placed in flat position can be raised while the wafers W are out of contact with the wafer boat 10. Thus, the peripheral portion 46 of each of the wafers can be kept apart from the corresponding groove bottom portion 44 of each of the wafer holding rods.

Therefore, the wafers W can be heat-treated without an occurrence of excessive stress caused by a difference of the thermal expansions of the wafers and the wafer boat. As a result, the wafers W can be prevented from slip dislocating 87, thereby increasing the yield of the wafers W.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A wafer boat rotating apparatus disposable between a wafer transfer unit adapted to transfer a plurality of wafers to a wafer boat having an opening at a bottom portion thereof, which boat is held in a horizontal direction, and a heat-treating unit adapted to heat-treat wafers held in the wafer boat in a vertical direction, said apparatus comprising:

a boat holding portion for holding both ends of a wafer boat;

a vertical rotation drive mechanism for rotating said boat holding portion on a vertical plane;

a horizontal rotation drive mechanism for rotating said boat holding portion on a horizontal plane; and a wafer holding member disposed on said boat holding portion and being adapted to keep wafers held in the wafer boat apart from a bottom portion of the wafer boat by a small distance.

2. The wafer boat rotating apparatus as set forth in claim 1,
wherein said boat holding portion has a holding brace extending in a longitudinal direction of the wafer boat, and
wherein said wafer holding member comprises at least one wafer lift-up plate disposed on said holding member and being in contact with a lower end of each wafer.

3. The wafer boat rotating apparatus as set forth in claim 2,
wherein said wafer holding member comprises one wafer lift-up plate.

4. The wafer boat rotating apparatus as set forth in claim 2,
wherein said wafer holding member comprises a pair of wafer lift-up plates.

5. The wafer boat rotating apparatus as set forth in claim 4,
wherein said pair of wafer lift-up plates form a space which is open upward and downwardly.

6. The wafer boat rotating apparatus as set forth in claim 2,
wherein said wafer lift-up plate has a quartz contact portion adapted to be in contact with a lower end of each wafer.

7. The wafer boat rotating apparatus as set forth in claim 2,
wherein the wafer boat has at least one reinforcement member disposed in a direction perpendicular to the longitudinal direction thereof, and
wherein said wafer lift-up plate has at least one concave portion for accepting the reinforcement member.

8. The wafer boat rotating apparatus as set forth in claim 2,
wherein said boat holding portion has a pair of boat holding arms disposed on said holding brace and adapted to hold both ends of the wafer boat, and
wherein a center of said wafer lift-up plate corresponds to a center of said boat holding arms.

9. The wafer boat rotating apparatus as set forth in claim 2,
wherein the wafer boat comprises a pair of holding plates and a plurality of wafer holding rods extending in the longitudinal direction of the wafer boat between the holding plates, the wafer holding rods having a plurality of wafer holding grooves for holding wafers, and
wherein said wafer lift-up plate is adapted to keep wafers apart from a bottom portion of a corresponding wafer holding groove of at least a lowest one of the wafer holding rods.

10. The wafer boat rotating apparatus as set forth in claim 9,
wherein said wafer lift-up plate is adapted to keep wafers apart from the bottom portion of the corresponding wafer holding groove of each of the wafer holding rods.

11. The wafer boat rotating apparatus as set forth in claim 10,
wherein said wafer lift-up plate is adapted to keep wafers equally apart from the bottom portion of the corresponding wafer holding groove of each of the wafer holding rods.

12. The wafer boat rotating apparatus as set forth in claim 10,
wherein held wafers have a diameter of eight inches, and
wherein said wafer holding member is adapted to lift up wafers from the wafer boat by 0.5 to 1.0 mm.

* * * * *